US012701905B2

(12) United States Patent
An

(10) Patent No.: US 12,701,905 B2
(45) Date of Patent: Aug. 4, 2026

(54) DISPLAY PANEL AND DISPLAY DEVICE

(71) Applicant: Wuhan Tianma Microelectronics Co., Ltd., Wuhan (CN)

(72) Inventor: Haoyue An, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 393 days.

(21) Appl. No.: 18/407,991

(22) Filed: Jan. 9, 2024

(65) Prior Publication Data
US 2024/0147818 A1 May 2, 2024

(30) Foreign Application Priority Data

Aug. 30, 2023 (CN) .......................... 202311121478.5

(51) Int. Cl.
H10K 59/80 (2023.01)
H10K 59/121 (2023.01)
H10K 59/131 (2023.01)
(52) U.S. Cl.
CPC ....... H10K 59/874 (2023.02); H10K 59/1213 (2023.02); H10K 59/131 (2023.02); H10K 59/873 (2023.02)

(58) Field of Classification Search
None
See application file for complete search history.

(56) References Cited

U.S. PATENT DOCUMENTS

2009/0321842 A1* 12/2009 Matsubara ......... H10D 84/0177
438/585

FOREIGN PATENT DOCUMENTS

EP 3252817 A1 * 12/2017 ........... H10D 84/859

* cited by examiner

*Primary Examiner* — Michelle Mandala
(74) *Attorney, Agent, or Firm* — KDW Firm PLLC

(57) ABSTRACT

Provided are a display panel and a display device. The display panel includes a base substrate, and a metal oxide transistor and a performance adjustment portion that are located on the base substrate. The metal oxide transistor and the performance adjustment portion do not overlap in the thickness direction of the display panel. Based on the preceding solution, hydrogen elements can be effectively prevented from affecting the performance of the metal oxide transistor, the reliability of the metal oxide transistor can be improved, and the performance adjustment portion can be prevented from affecting the performance of the metal oxide transistor at the same time.

20 Claims, 14 Drawing Sheets

21

22

103

21

22

103

701

1034/10341

1035

DISPLAY PANEL AND DISPLAY DEVICE

This application claims priority to Chinese Patent Application No. 202311121478.5 filed Aug. 30, 2023, the disclosure of which is incorporated herein by reference in its entirety.

TECHNICAL FIELD

The present disclosure relates to the technical field of display panels and, in particular, to a display panel and a display device.

BACKGROUND

A metal oxide transistor has a simple preparation process and has characteristics of a high carrier mobility and low leakage current and thereby is applied in a driving circuit of a display panel. Therefore, the performance of the metal oxide transistor plays a decisive role in the display effect of the display panel.

Through research, hydrogen elements have a great influence on the performance of the metal oxide transistor. Specifically, oxygen atoms in a metal oxide are easily reduced by hydrogen atoms, resulting in oxygen vacancies and an electrical performance drift in the metal oxide transistor.

In some existing solutions, due to factors such as the process, or the structures of the display panel, the content of hydrogen elements in an active layer in the metal oxide transistor is often too high, thereby affecting the performance of the metal oxide transistor and finally affecting the display of the display panel.

SUMMARY

To solve the preceding technical solutions, the present disclosure provides a display panel and a display device.

In a first aspect, the present disclosure provides a display panel. The display panel includes a base substrate, and a metal oxide transistor and a performance adjustment portion that are located on the base substrate. The metal oxide transistor and the performance adjustment portion do not overlap in a thickness direction of the display panel.

In a second aspect, the present disclosure further includes a display device including a display panel. The display panel includes a base substrate, and a metal oxide transistor and a performance adjustment portion that are located on the base substrate. The metal oxide transistor and the performance adjustment portion do not overlap in a thickness direction of the display panel. Compared with the related art, technical solutions provided by embodiments of the present disclosure have the following advantages.

BRIEF DESCRIPTION OF DRAWINGS

The drawings used herein, incorporated into and constituting a part of the specification, illustrate embodiments complying with the present disclosure and serve to explain the principles of the present disclosure together with the specification.

To illustrate technical solutions in embodiments of the present invention or in the related art more clearly, drawings used in description of the embodiments or the related art will be briefly described below. Apparently, those skilled in the art may also obtain other drawings based on the drawings described below on the premise that no creative work is done.

DETAILED DESCRIPTION

To obtain a clearer understanding of objects, features and advantages of the present disclosure, the solutions of the present disclosure will be further described. It is to be noted that if not in collision, the embodiments and features therein in the present disclosure may be combined with each other.

Details are set forth below to facilitate a thorough understanding of the present disclosure. However, the present disclosure may also be implemented by other embodiments different from the embodiments described herein. Apparently, the embodiments in the specification are merely part of, not all of, the embodiments of the present disclosure.

It is apparent to those skilled in the art that various modifications and variations in the present invention may be made without departing from the spirit or scope of the present invention. Therefore, the present invention is intended to cover modifications and variations of the present invention that fall within the scope of the corresponding claims (the claimed technical solutions) and their equivalents. It is to be noted that the embodiments of the present invention, if not in collision, may be combined with each other.

In embodiments of the present disclosure, the display panel may be an organic light-emitting diode (OLED) display panel, but the type of display panel is not limited in the embodiments of the present disclosure. The display panel provided by the embodiments of the present disclosure may be any type of display panel in which a metal oxide transistor is present in a driving circuit. Through search, hydrogen elements have a great influence on the performance of an active layer of the metal oxide transistor, including, but not limited to, the influence on the mobility and threshold voltage of the active, and the higher the concentration of the hydrogen elements, the greater the influence on the electrical performance of the metal oxide transistor. To reduce the sources of the hydrogen elements, the material of a dielectric layer of the metal oxide transistor uses silicon oxide (SiOx) to replace silicon nitride (SiNx) (such as a buffer layer, an inter-layer insulating layer and a passivation (PV) layer), but according to different chemical vapor deposition (CVD) film formation conditions, a SiOx thin film still contains a relatively large hydrogen content. These hydrogen elements have an opportunity to diffuse into the active layer of the metal oxide transistor from the SiOx thin film in a subsequent high-temperature process or a local high-temperature generated by a current during operation of a display so that an abnormal picture display phenomenon is caused by a shift of the electrical performance of the metal oxide transistor, for example, a light spot is generated.

Figure 1:
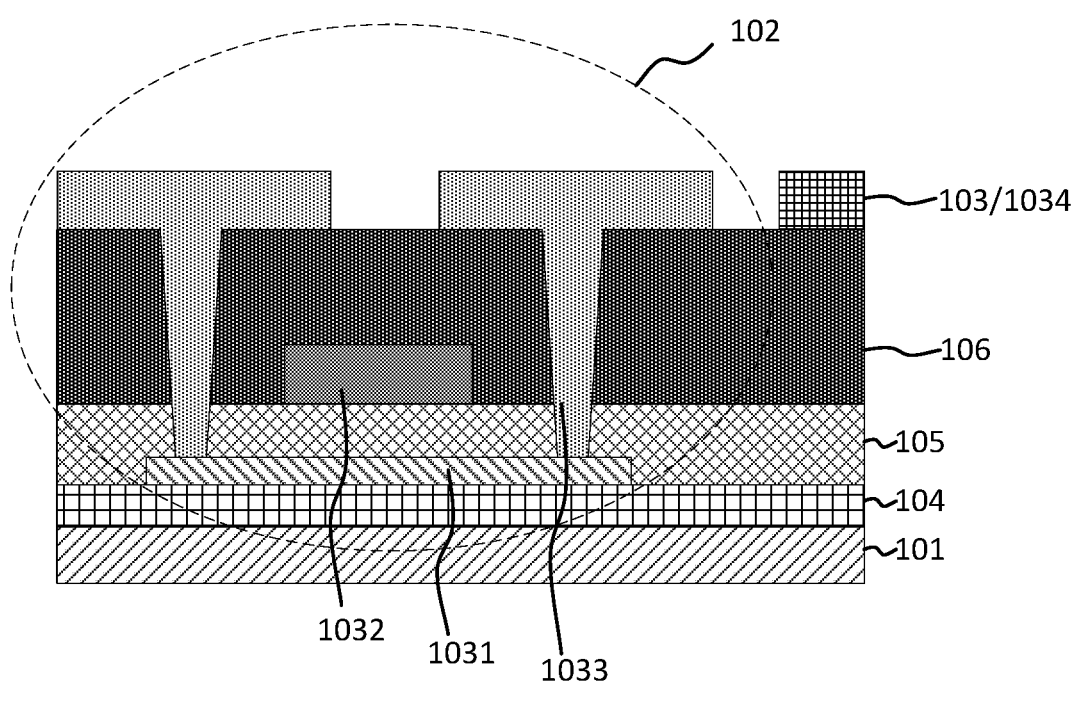
FIG. 1 is a diagram illustrating the structure of a film of a display panel according to embodiments of the present disclosure.

To solve the preceding problems, embodiments of the present disclosure provide a display panel. FIG. 1 is a diagram illustrating the structure of a film of a display panel according to embodiments of the present disclosure. The display panel includes a base substrate 101, and a metal oxide transistor 102 and a performance adjustment portion 103 that are located on the base substrate 101. The metal oxide transistor 102 and the performance adjustment portion 103 do not overlap in the thickness direction of the display panel.

The performance adjustment portion 103 is configured to reduce the content of hydrogen elements in an active layer 1031 of the metal oxide transistor 102.

In the embodiments of the present disclosure, the performance adjustment portion 103 may be a structure that can achieve the effect of reducing the content of the hydrogen elements in the metal oxide transistor 102. In the embodiments of the present disclosure, the metal oxide transistor 102 may be a transistor in which a metal oxide is used as the active layer, and the electrical performance of the active layer is susceptible to drift due to the influence of the hydrogen elements. For example, in the embodiments of the present disclosure, the material of the active layer 1031 of the metal oxide transistor 102 may be an indium gallium zinc oxide (IGZO).

With continued reference to FIG. 1, the display panel may include the metal oxide transistor 102 and the performance adjustment portion 103. The metal oxide transistor 102 may include the active layer 1031, a first metal layer 1032 and a second metal layer 1033. In addition, the display panel may further include a buffer layer 104, a first insulating layer 105, a second insulating layer 106 and others. FIG. 1 merely exemplarily provides the structure of a film of a metal oxide transistor and does not limit the embodiments of the present disclosure. Other functional films are not illustrated in FIG. 1 for not being involved yet. However, it is to be understood by those skilled in the art that required films may be disposed, or the structural positions of the films may be adjusted in the embodiments of the present disclosure based on the display requirements of the display panel.

With continued reference to FIG. 1, a large amount of hydrogen elements are present in the first insulating layer 105, the second insulating layer 106, and other insulating layers that are not shown in FIG. 1 and may be present. Under the actions of an annealing process during the preparation of the display panel or the heat generated during the operation of the display panel, these hydrogen elements diffuse into the active layer 1031 over time to affect the performance of the metal oxide transistor 102. In the case where the performance adjustment portion 103 is disposed in the embodiments of the present disclosure, the content of the hydrogen elements in the active layer 1031 can be reduced, the hydrogen elements can be prevented from affecting the electrical performance of the active layer 1031, and the reliability of the metal oxide transistor 102 can be improved.

Figure 2:
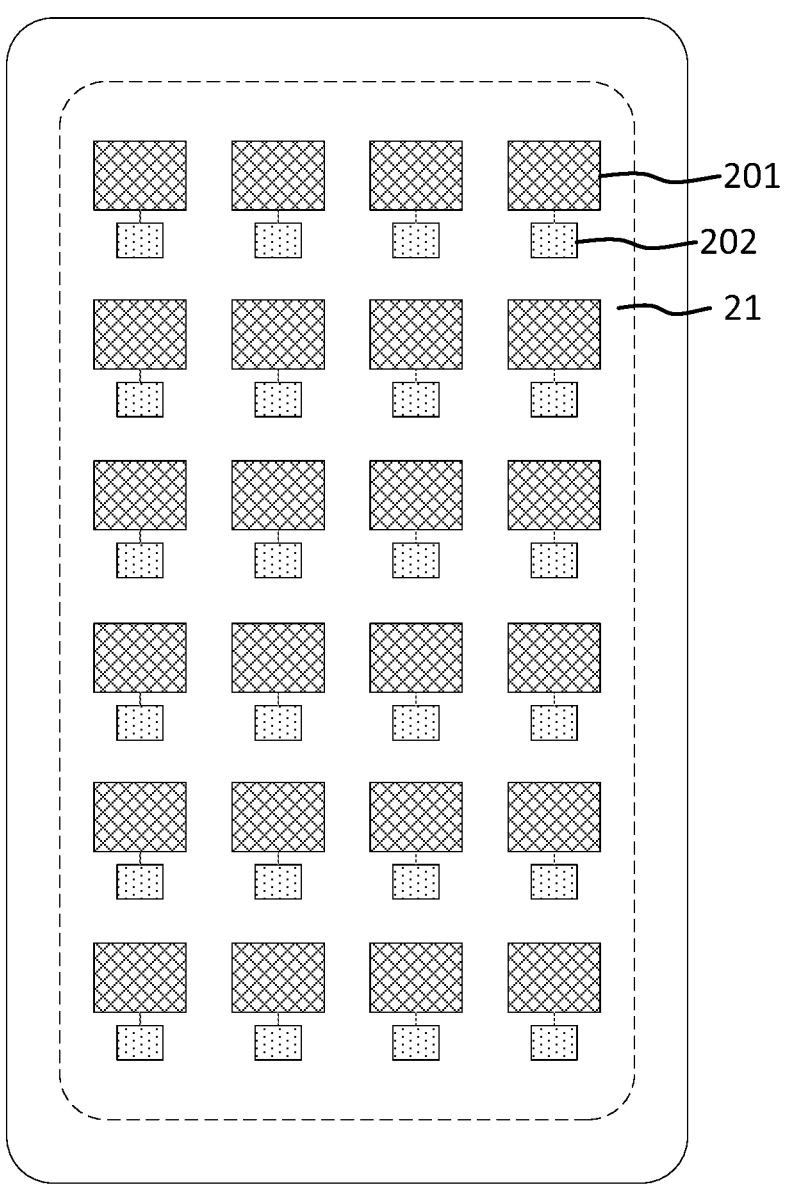
FIG. 2 is a diagram illustrating the structure of a display panel according to embodiments of the present disclosure.

FIG. 2 is a diagram illustrating the structure of a display panel according to embodiments of the present disclosure. In some optional embodiments, the display panel includes a display region 21. The display region 21 may be provided with multiple sub-pixels 201 and multiple pixel driving circuits 202 electrically connected to the multiple sub-pixels 201 in one-to-one correspondence. Each pixel driving circuit 202 includes the metal oxide transistor.

Referring to FIG. 2, the multiple sub-pixels 201 may be included in the display region 21, and each pixel driving circuit 202 may be configured to drive a respective sub-pixel 201 to display. The performance adjustment portion 103 is disposed in the embodiments of the present disclosure to reduce the content of the hydrogen elements in the active layer 1031 of the metal oxide transistor in each pixel driving circuit 202, so the hydrogen elements are prevented from affecting the electrical performance of the active layer 1031 of the metal oxide transistor in each pixel driving circuit 202 so that each pixel driving circuit 202 can normally control the respective sub-pixel 201 to display.

Figure 3:
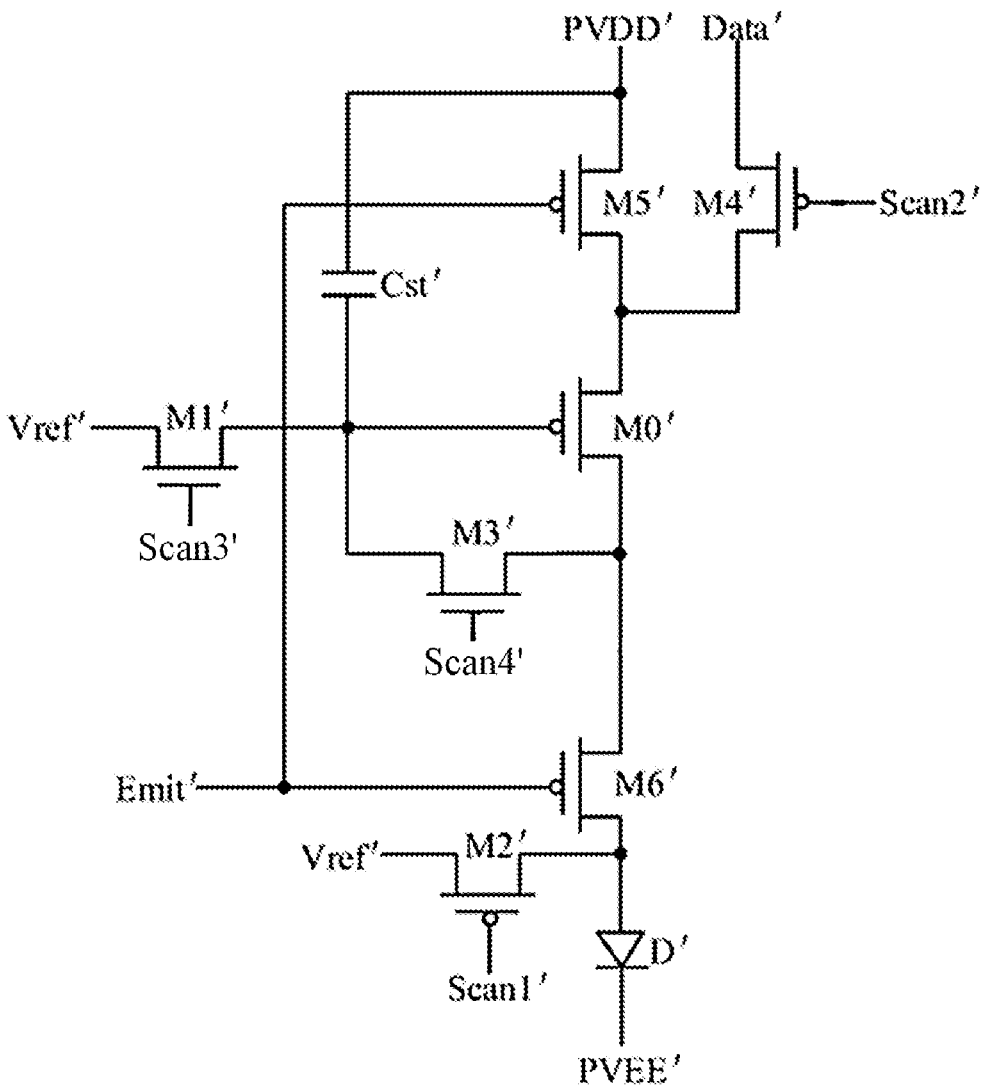
FIG. 3 is an equivalent circuit diagram illustrating a pixel driving circuit according to embodiments of the present disclosure.

FIG. 3 is an equivalent circuit diagram illustrating a pixel driving circuit according to embodiments of the present disclosure. Exemplarily, each pixel driving circuit provided by FIG. 3 includes seven transistors and a capacitance, such as a transistor M0', a transistor M1', a transistor M2', a transistor M3', a transistor M4', a transistor M5', a transistor M6' and a capacitance Cst' in the figure. FIG. 3 further includes a light-emitting element (such as an organic light-emitting element) D' and multiple signal terminals PVDD', PVEE', Data', Vref', Emit', Scan1', Scan2', Scan3', Scan4' and others that are connected to each pixel driving circuit. It is to be noted that FIG. 3 merely exemplarily illustrates an example structure provided for each pixel driving circuit and does not limit the specific circuit structure of each pixel driving circuit. In other embodiments, composed structures of each pixel driving circuit may be adjusted according to requirements. To prevent leakage currents of the transistors in each pixel driving circuit from affecting the control of the respective sub-pixel 201, the transistors in each pixel driving circuit may use metal oxide transistors, such as M1', M3' and others in FIG. 3, or all the transistors in FIG. 3 may be metal oxide transistors. In the case where at least one metal oxide transistor is included in each pixel driving circuit, the content of hydrogen elements in an active layer of the at least one metal oxide transistor may be reduced through the solutions in the embodiments of the present disclosure.

In some optional embodiments, the performance adjustment portion 103 is located between adjacent pixel driving circuits 202.

In an embodiment, a certain clearance is present between the adjacent pixel driving circuits 202 in the display panel. In the embodiments of the present disclosure, the performance adjustment portion 103 may be disposed between the adjacent pixel driving circuits 202. Consequentially, the performance adjustment portion 103 may be disposed between the adjacent pixel driving circuits 202 in the entire display region 21 to reduce the content of hydrogen elements in adjacent metal oxide transistors 102.

Figure 4:
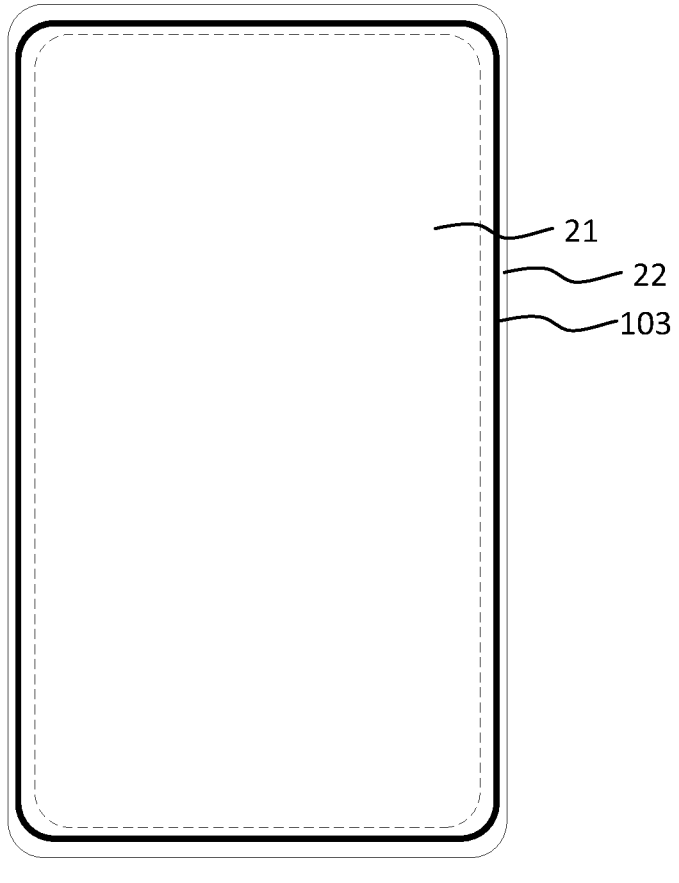
FIG. 4 is another diagram illustrating the structure of a display panel according to embodiments of the present disclosure.

FIG. 4 is another diagram illustrating the structure of a display panel according to embodiments of the present disclosure. In some optional embodiments, the display panel further includes a non-display region 22, and the performance adjustment portion 103 is located in the non-display region 22.

In the embodiments of the present disclosure, the performance adjustment portion 103 is disposed in the non-display region to reduce the content of the hydrogen elements in the active layer 1031. While the content of the hydrogen elements in the active layer 1031 is reduced, and the reliability of the metal oxide transistor 102 is improved, since the performance adjustment portion 103 is disposed in the non-display region 22, the wiring in the display region 21 is also prevented from being affected by occupying the space of the display region 21 so that the wiring space of other elements in the display region 21 can be more spacious.

Figure 5:
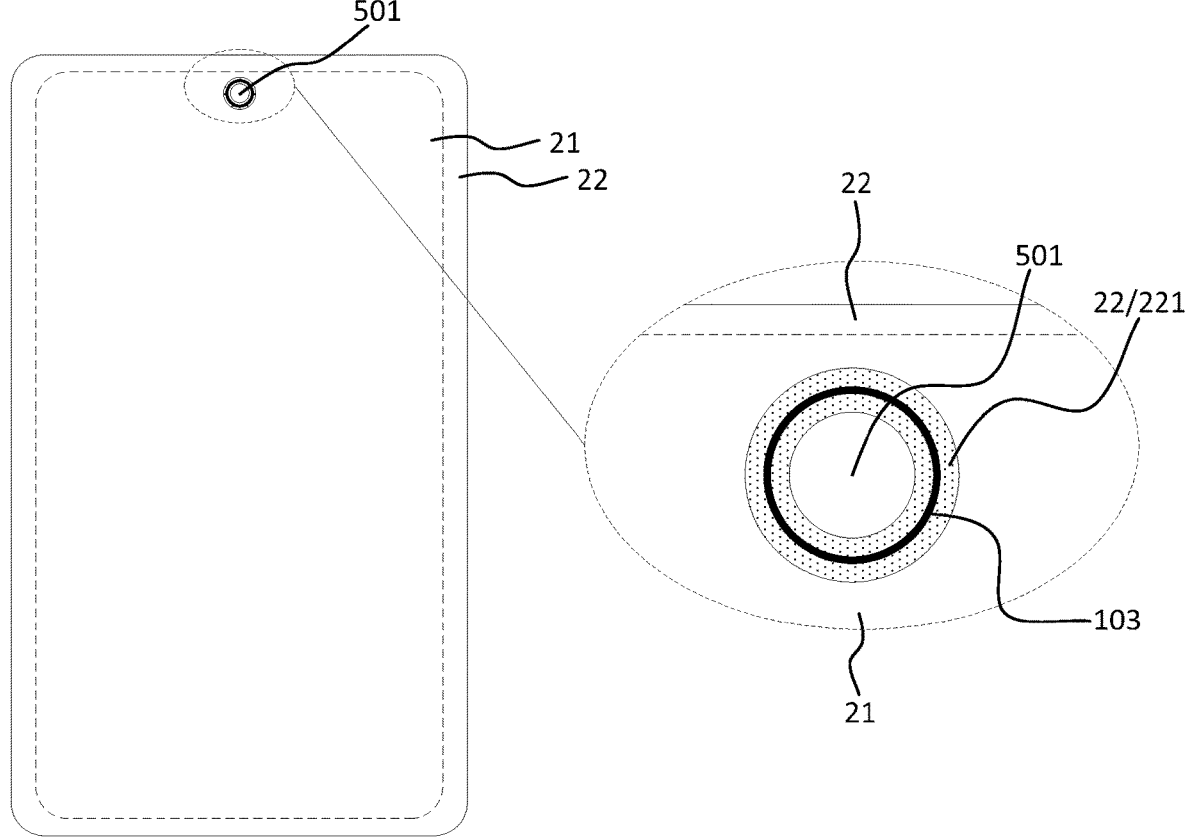
FIG. 5 is another diagram illustrating the structure of a display panel according to embodiments of the present disclosure.

FIG. 5 is another diagram illustrating the structure of a display panel according to embodiments of the present disclosure. In some optional embodiments, the display panel includes an optical component region 501, the non-display region 22 includes a wiring region 221 surrounding the optical component region 501, the display region 21 surrounds the wiring region 221, and at least part of the performance adjustment portion 103 is located in the wiring region 221. Referring to FIG. 5, some regions of the display panel may be provided with the optical component region 501 for placing an optical component. Specifically, the optical component region 501 may be formed in two manners: through holes or blind holes. The periphery of the optical component region 501 is still the display region 21, and the wiring area 221 for wiring is disposed at the periphery of the optical component region 501 so that a buffer region can be formed to a certain extent to prevent water and oxygen in the air from entering the display panel to affect the display panel.

In the embodiments of the present disclosure, the performance adjustment portion 103 is disposed in the wiring region 221. The arrangement of the performance adjustment portion 103 can reduce the content of the hydrogen elements in the active layer 1031, prevent the hydrogen elements from affecting the metal oxide transistor 102 in the display region 21 and a metal oxide transistor 102 that is possibly present in the wiring region and ensure the reliability of the metal oxide transistors 102.

Figure 6:
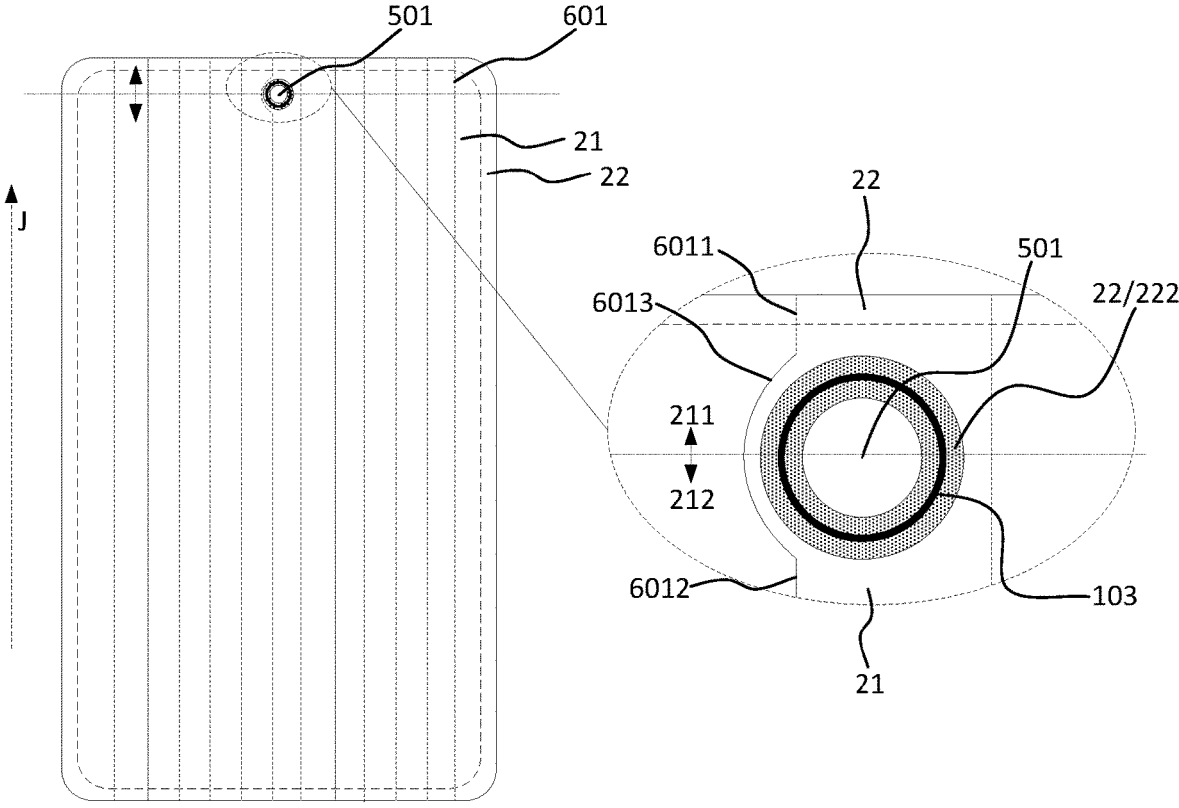
FIG. 6 is another diagram illustrating the structure of a display panel according to embodiments of the present disclosure.

FIG. 6 is another diagram illustrating the structure of a display panel according to embodiments of the present disclosure. In some optional embodiments, the display panel includes the optical component region 501, the non-display region 22 includes a bezel region 222 surrounding the optical component region 501, and the display region 21 surrounds the bezel region 222 and includes a first display region 211 and a second display region 212 that are located on two sides of the optical component region 501 respectively.

The display panel further includes multiple signal lines 601. The multiple signal lines 601 include a first sub-portion 6011 and a second sub-portion 6012. The first sub-portion 6011 is disposed in the first display region 211, and the second sub-portion 6012 is disposed in the second display region 212. The multiple signal lines 610 further include a coiling segment 6013 connecting the first sub-portion 6011 and the second sub-portion 6012. The coiling portion 6013 is disposed in the display region 21. The at least part of the performance adjustment portion 103 is located in the bezel region 222.

With continued reference to FIG. 6, the multiple signal lines 601 in the display panel may at least include a data line, a scan line and others. An example in which the multiple signal lines 601 are data lines is used in FIG. 6. The multiple signal lines 601 extend along the first direction. The direction in which J is located is denoted as the first direction in FIG. 6. In some embodiments, the coiling portion 6013 is disposed in the bezel region 222, but for such a solution, the width of the bezel region 222 is increased due to the increased lines in the bezel region 222. In this regard, in some solutions, the coiling portion 6013 may also be disposed in the display region 21 to reduce the width of the bezel region 222. This is known as the fanout in active area (FIAA) technology. The bezel region 222 can be narrowed based on the FIAA technology. In the embodiments of the present disclosure, the at least part of the performance adjustment portion 103 is disposed in the bezel region 222. Through the performance adjustment portion 103, the content of the hydrogen elements in the active layer 1031 can be reduced, and the reliability of the metal oxide transistor 102 can be improved.

With continued reference to FIG. 4, in some optional embodiments, the non-display region 22 surrounds at least part of the display region 21.

In an embodiment, the non-display region 22 may surround the at least part of the display region 21. An example in which the non-display region 22 surrounds the entire display region 21 is used in FIG. 4 for illustration. In the embodiments of the present disclosure, the performance adjustment portion 103 may be disposed in the non-display region 22. Consequentially, the performance adjustment portion 103 disposed in the non-display region 22 can reduce the content of the hydrogen elements in the metal oxide transistor 102, prevent the hydrogen elements from affecting the electrical performance of the metal oxide transistor 102 and ensure the reliability of the metal oxide transistor 102.

Figure 7:
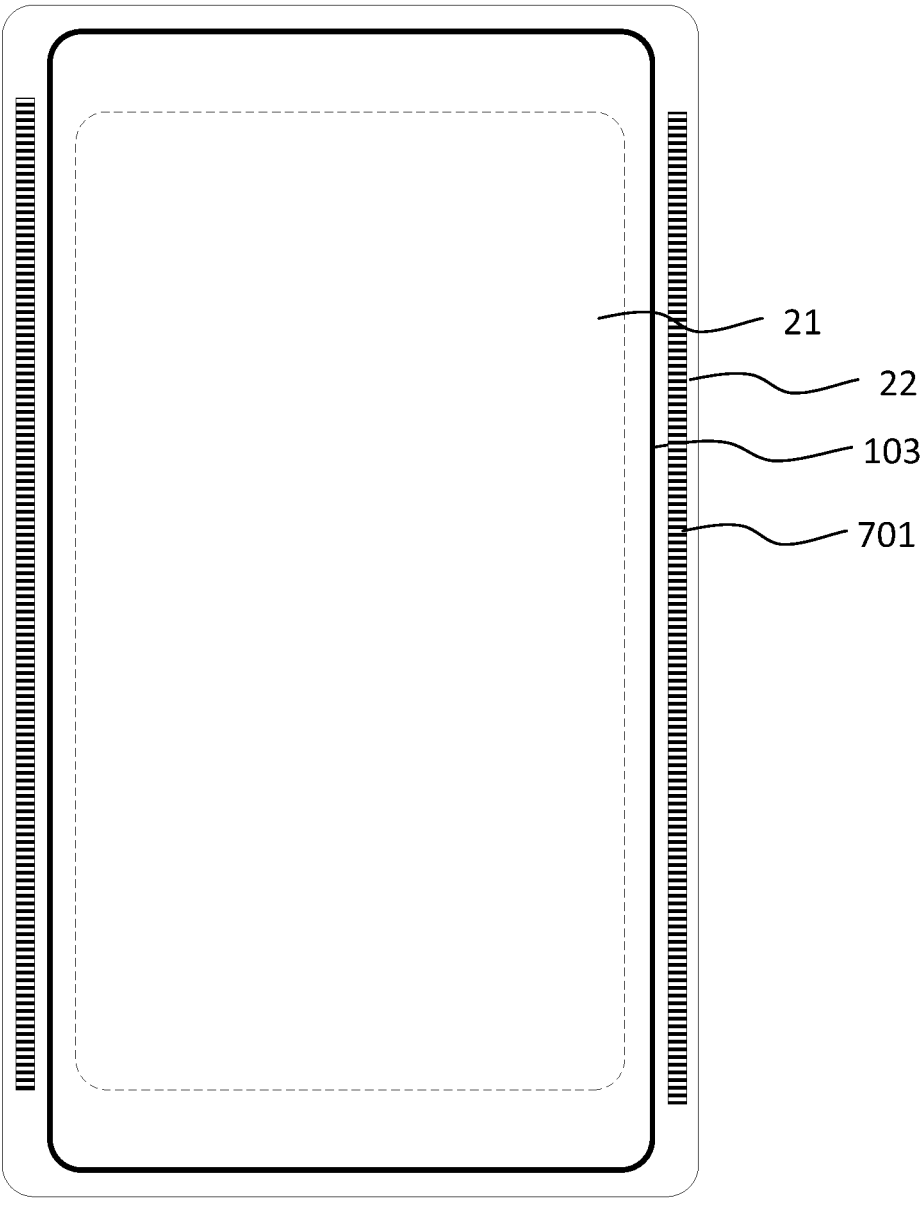
FIG. 7 is another diagram illustrating the structure of a display panel according to embodiments of the present disclosure.

FIG. 7 is another diagram illustrating the structure of a display panel according to embodiments of the present disclosure. In some optional embodiments, the display panel includes the display region 21 and the non-display region 22, the non-display region 22 includes a peripheral circuit 701, the peripheral circuit 701 includes the metal oxide transistor, and the performance adjustment portion 103 is disposed in the non-display region 22.

Referring to FIG. 7, the peripheral circuit 701 such as a vertical shift register circuit (VSR) is also present in the non-display region 22. The peripheral circuit 701 may generally include a SCAN circuit and/or an EMIT circuit, but the SCAN circuit and the EMIT circuit are not described in more detail herein. However, it is to be understood that a metal oxide transistor may be included in both the SCAN circuit and the EMIT circuit, and an insulating layer is also present in the non-display region 22, where hydrogen elements may also diffuse into an active layer over time due to an annealing process during the preparation of the display panel and the heat generated during the operation of the display panel so as to affect the performance of the metal oxide transistor. In this regard, in the embodiments of the present disclosure, the performance adjustment portion 103 may also be disposed in the vicinity of the metal oxide transistor of the peripheral circuit 701. With the preceding configuration, the performance adjustment portion 103 can reduce the content of hydrogen elements in the active layer of the metal oxide transistor of the peripheral circuit 701 and improve the reliability of the metal oxide transistor.

In some optional embodiments, the performance adjustment portion 103 includes a hydrogen absorbent layer and/or multiple vias. The multiple vias pass through at least part of the insulating layers of the display panel.

In the embodiments of the present disclosure, a performance adjustment layer may be a specific film structure such as the hydrogen absorbent layer or may also be a digging hole, such as a via, obtained by an etching process on an insulating layer. The performance adjustment portion 103 is embodied in the form of a hydrogen absorbent layer in the embodiments corresponding to FIGS. 1, 4, 5, 6 and 7, but it is to be understood that the performance adjustment portion 103 in FIGS. 1, 4, 5, 6 and 7 may be in the form of a via and/or a hydrogen absorbent layer in some certain embodiments.

Figure 8:
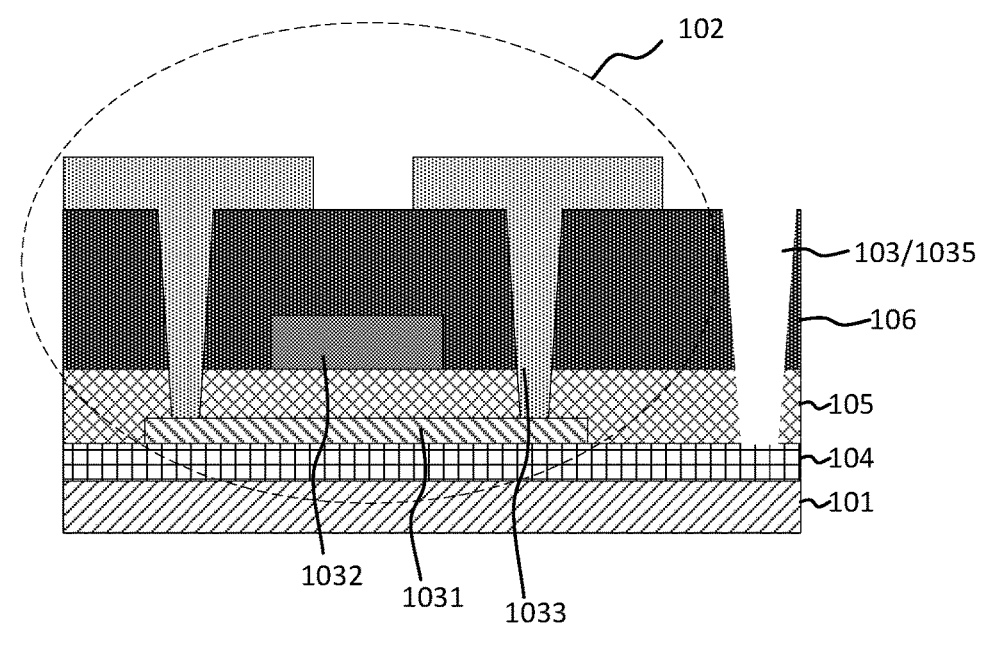
FIG. 8 is another diagram illustrating the structure of a film of a display panel according to embodiments of the present disclosure.

FIG. 8 is another diagram illustrating the structure of a film of a display panel according to embodiments of the present disclosure. Referring to FIG. 8, the performance adjustment portion 103 may be also a via 1035. Specifically, the multiple vias 1035 may be disposed in the insulating layers of the display panel to reduce the content of the hydrogen elements in the metal oxide transistor 102.

Specifically, at least one of multiple insulating layers may be etched through etching, and after the at least one of the multiple insulating layers is etched, a high-temperature annealing process may be performed on the display panel. During the annealing process, hydrogen elements in the at least one of the multiple insulating layers and indium gallium zinc oxide (IGZO) are diffused and released through the multiple vias 1035, so the content of the hydrogen elements in the metal oxide transistor 102 can be reduced. During the specific preparation process, in the embodiments of the present disclosure, holes may be dug once after the multiple insulating layers are prepared, or a hole may also be dug after an insulating layer is prepared each time. This is not limited herein.

Figure 9:
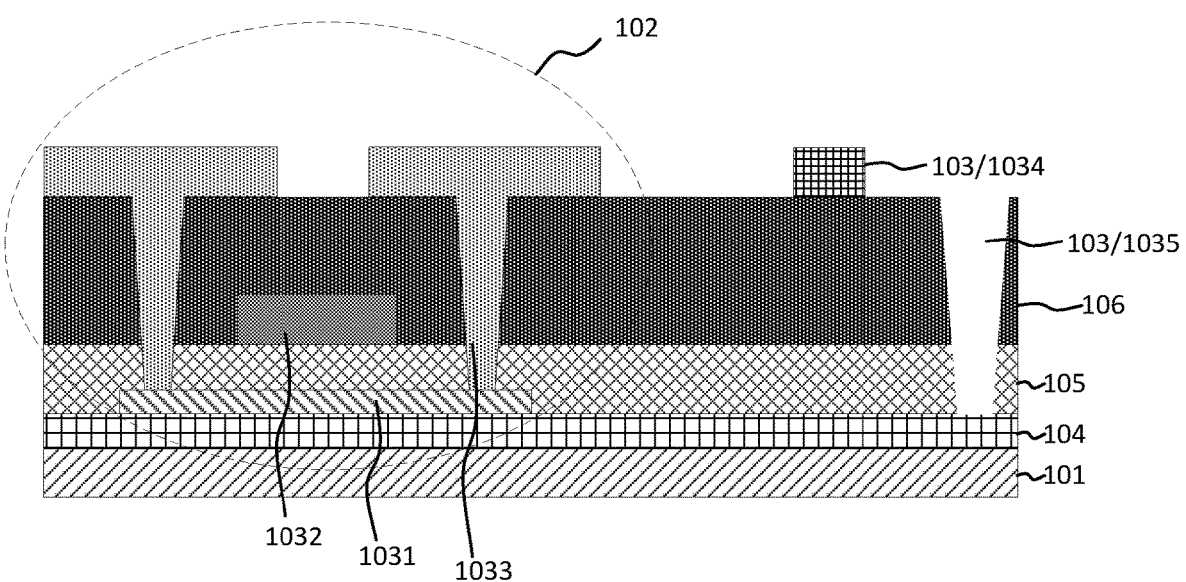
FIG. 9 is another diagram illustrating the structure of a film of a display panel according to embodiments of the present disclosure.

FIG. 9 is another diagram illustrating the structure of a film of a display panel according to embodiments of the present disclosure. Referring to FIG. 9, in the embodiments of the present disclosure, the hydrogen absorbent layer 1034 and the multiple vias 1035 may also be simultaneously disposed in the display panel to reduce the content of the hydrogen elements in the IGZO. In the embodiments of the present disclosure, for example, the configuration of the multiple vias 1035 can diffuse the hydrogen elements diffused from the display panel during the annealing process into the air, and the configuration of the hydrogen absorbent layer 1034 can absorb hydrogen elements diffused from the multiple vias 1035 or the insulating layers.

The effect of reducing the content of the hydrogen elements in the IGZO is better through the simultaneous operation of the two manners.

Figure 10:
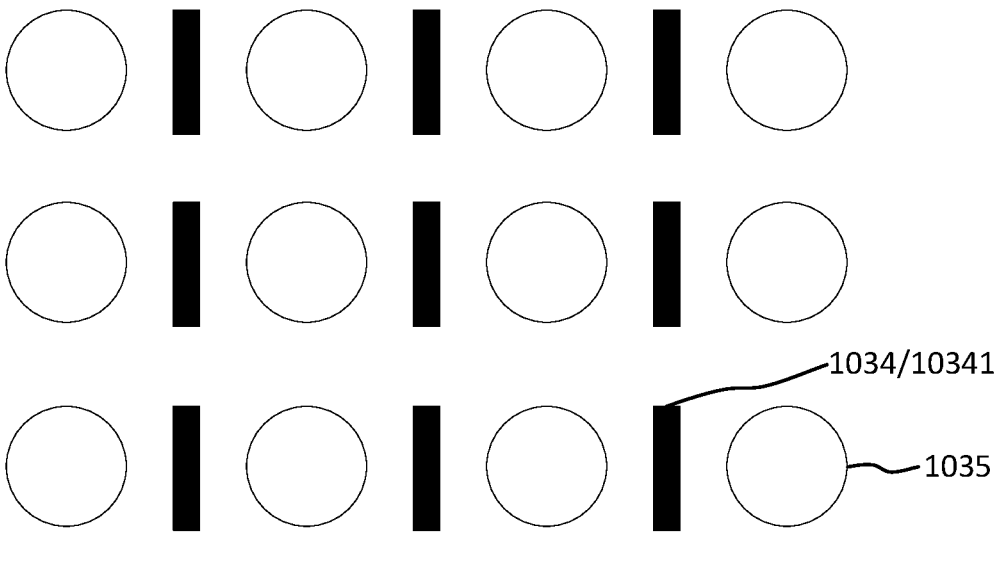
FIG. 10 is another diagram illustrating the structure of a display panel according to embodiments of the present disclosure.

FIG. 10 is another diagram illustrating the structure of a display panel according to embodiments of the present disclosure. In some optional embodiments, the hydrogen absorbent layer 1034 includes a first hydrogen absorbent sub-portion 10341, and the first hydrogen absorbent sub-portion 10341 is located between two adjacent vias 1035 viewed from the direction perpendicular to the plane on which the base substrate 101 is located.

Referring to FIG. 10, the multiple vias 1035 and the hydrogen absorbent layer 1034 can be simultaneously disposed to improve the effect of reducing the hydrogen elements in the metal oxide transistor 102. For an embodiment in which the hydrogen absorbent layer 1034 and the multiple vias 1035 are simultaneously disposed, multiple arrangement manners may be present between the hydrogen absorbent layer 1034 and the multiple vias 1035. In an embodiment corresponding to FIG. 10, the hydrogen absorbent layer 1034 may be located between the two adjacent vias 1035.

Figure 11:
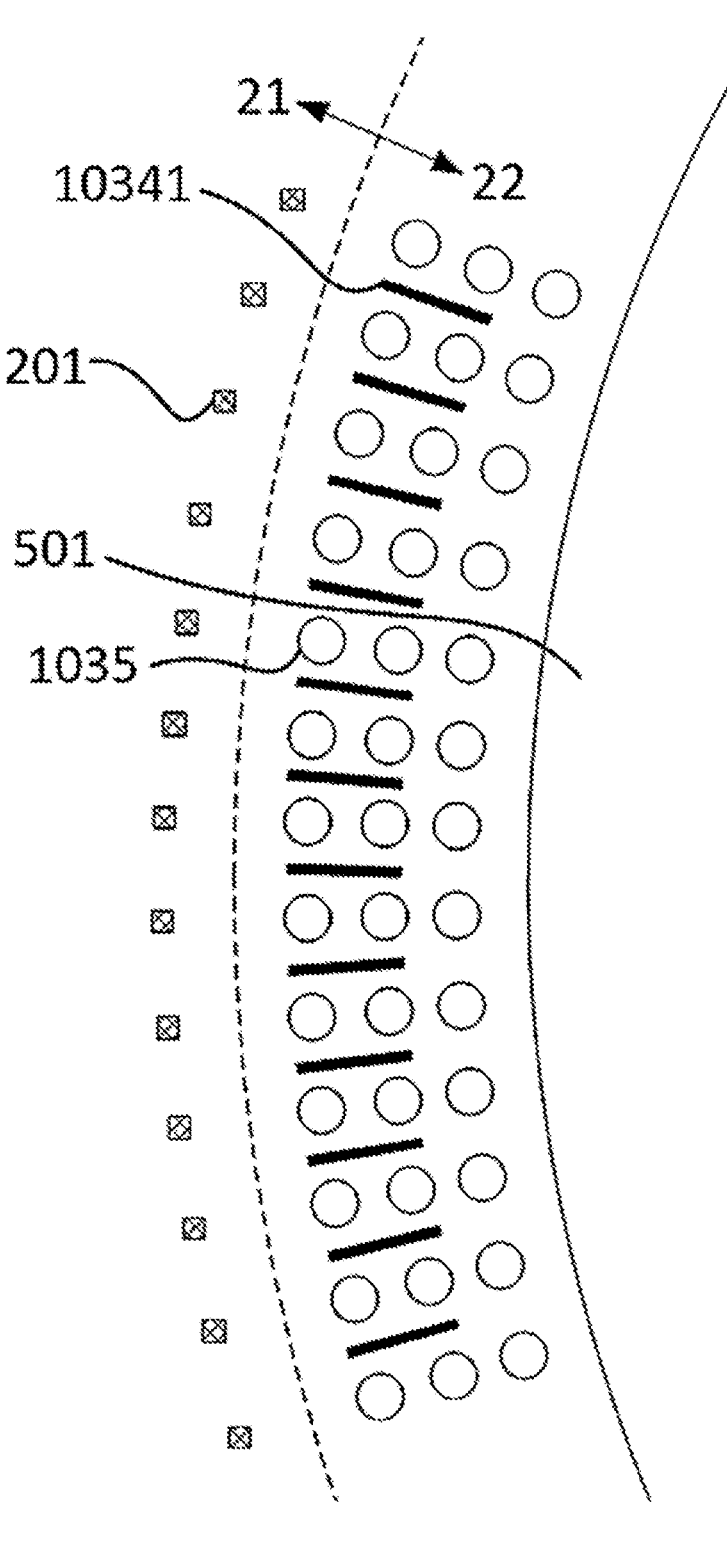
FIG. 11 is another diagram illustrating the structure of a display panel according to embodiments of the present disclosure.

FIG. 11 is another diagram illustrating the structure of a display panel according to embodiments of the present disclosure. In some optional embodiments, the display panel includes the display region 21 and the non-display region 22, the first hydrogen absorbent sub-portion 10341 and the multiple vias 1035 are located in the non-display region 22, and the multiple vias 1035 are arranged in an array in the non-display region 22, where among at least one column of vias 1035 facing away from the display region 21, a first hydrogen absorbent sub-portion 10341 is not present between two adjacent vias 1035 viewed from the direction perpendicular to the plane on which the base substrate 101 is located.

Referring to FIG. 11, the multiple vias 1035 may be arranged in an array, a first hydrogen absorbent sub-portion 10341 may be present between any two adjacent vias 1035, and a first hydrogen absorbent sub-portion may not be present between any two adjacent vias 1035 that are closest to the display region 21. The structure of the display panel in the position in which the optical component region 501 in the display panel is located is exemplarily illustrated in FIG. 11, but it is to be understood that in the embodiments of the present disclosure, in any position of the display panel, among the at least one column of vias 1035 facing away from the display region 21, the first hydrogen absorbent sub-portion 10341 may not be present between the two adjacent vias 1035 viewed from the direction perpendicular to the plane on which the base substrate 101 is located.

Figure 12:
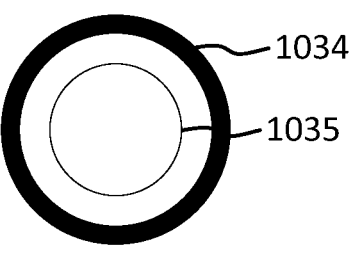
FIG. 12 is another diagram illustrating the structure of a display panel according to embodiments of the present disclosure.

FIG. 12 is another diagram illustrating the structure of a display panel according to embodiments of the present disclosure. In some optional embodiments, the hydrogen absorbent layer 1034 surrounds at least one via 1035 viewed from the direction perpendicular to the plane on which the base substrate 101 is located.

Based on the configuration manners in FIGS. 10, 11 and 12, the content of the hydrogen elements in the metal oxide transistor 102 and the insulating layers can be simultaneously reduced through the manners of the hydrogen absorbent layer 1034 and the multiple vias 1035.

Figure 13:
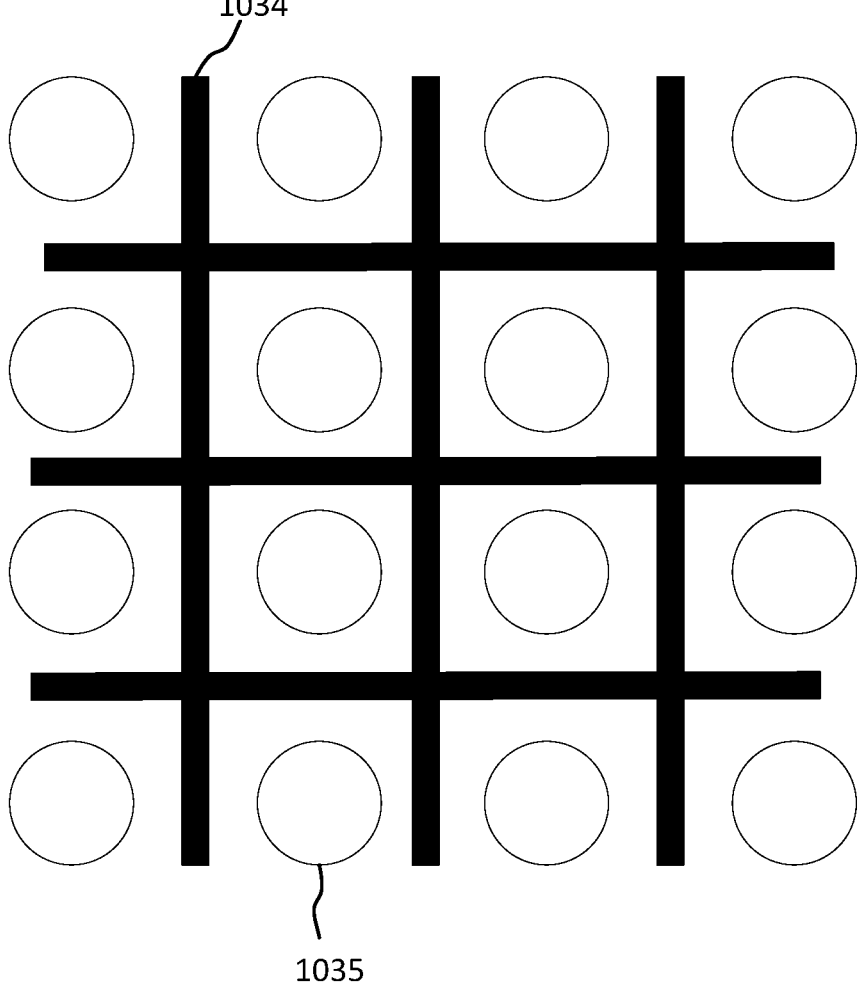
FIG. 13 is another diagram illustrating the structure of a display panel according to embodiments of the present disclosure.

FIG. 13 is another diagram illustrating the structure of a display panel according to embodiments of the present disclosure. In some optional embodiments, the hydrogen absorbent layer 1034 is in a grid shape.

The configuration of the hydrogen absorbent layer 1034 in a grid shape can greatly increase the area and absorbent scope of the hydrogen absorbent layer 1034. Due to the larger area and larger absorbent scope of the hydrogen absorbent layer 1034, the hydrogen absorbent layer 1034 can absorb more hydrogen elements in the larger scope so that the effect of reducing the hydrogen elements in the metal oxide transistor 102 can be achieved to a greater extent.

Figure 14:
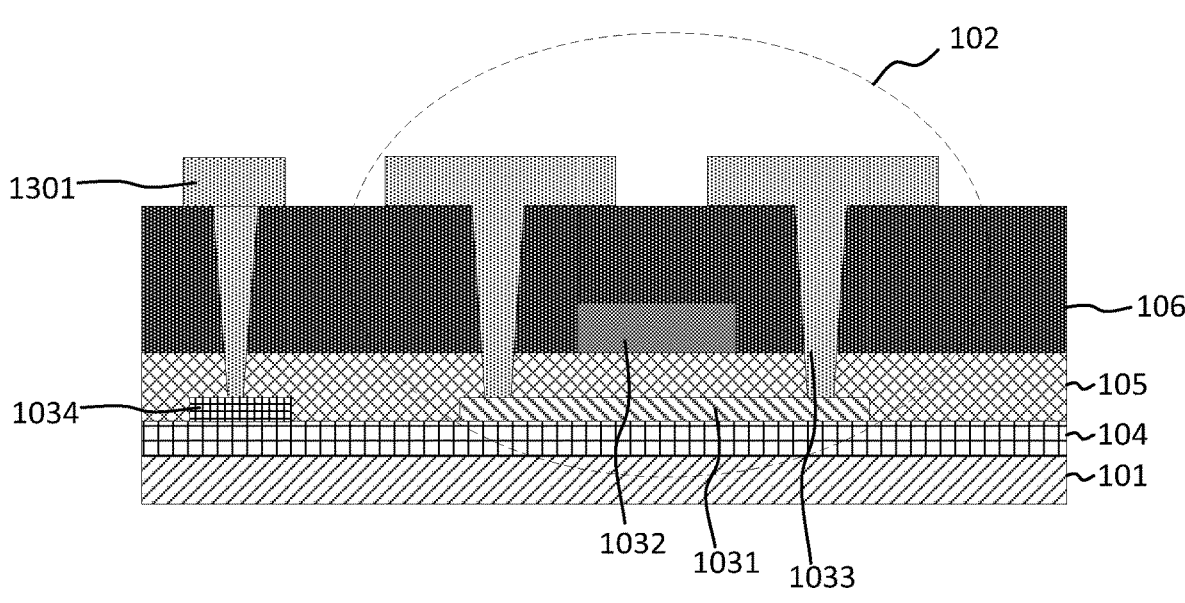
FIG. 14 is another diagram illustrating the structure of a film of a display panel according to embodiments of the present disclosure.

FIG. 14 is another diagram illustrating the structure of a film of a display panel according to embodiments of the present disclosure. In some optional embodiments, the hydrogen absorbent layer 1034 is floating or is electrically connected to a fixed voltage signal.

In an embodiment, lines of multiple fixed voltage signals may be included in the display panel. An example of a forward power voltage signal line 1301 is used in the embodiments of the present disclosure. The hydrogen absorbent layer 1034 may be a conductive material and is electrically connected to the forward power voltage signal line 1301.

Referring to FIG. 14, the forward power voltage signal line 1301 may be configured to supply a forward power signal PVDD to each pixel driving circuit of the respective sub-pixel 201. Multiple forward power voltage signal lines 1301 are disposed in the display region of the display panel. Since the multiple forward power voltage signal lines 1301 need to perform transmissions from the bottom of the display panel to the top of the display panel, the resistances of the multiple forward power voltage signal lines 1301 cause relatively high voltage drops so that a relatively large difference can be present in the voltages received by the multiple sub-pixels 201 in different positions, and a display anomaly can occur. In this regard, in the embodiments of the present disclosure, the hydrogen absorbent layer 1034 may be electrically connected to the forward power voltage signal line 1301. This is equivalent to parallel connecting a conductive layer to the forward power voltage signal line 1301 so that the resistance of the forward power voltage signal line 1301 can be reduced to a certain extent.

As an optional embodiment, the hydrogen absorbent layer 1034 may also be electrically connected to lines of any other possible fixed voltage signals to achieve a similar effect of reducing the line resistance to FIG. 14. These cannot be enumerated in the embodiments of the present disclosure one by one, and details are not described herein.

In some optional embodiments, the hydrogen absorbent layer 1034 may also be in a floating state instead of being connected to other circuits.

Figure 15:
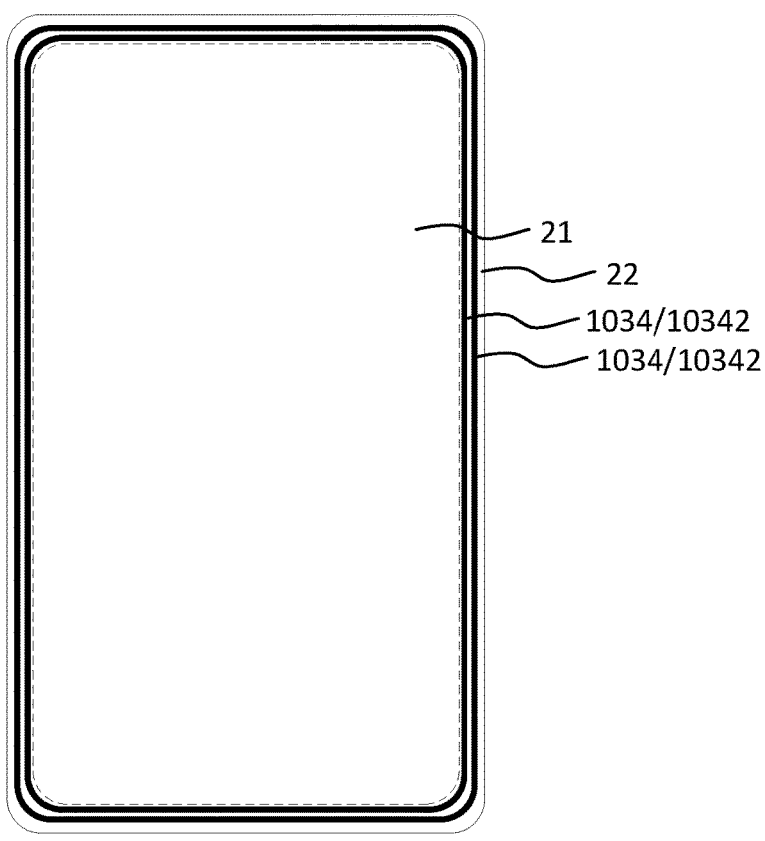
FIG. 15 is another diagram illustrating the structure of a display panel according to embodiments of the present disclosure.

FIG. 15 is another diagram illustrating the structure of a display panel according to embodiments of the present disclosure. In some optional embodiments, the hydrogen absorbent layer 1034 includes at least one second hydrogen absorbent sub-portion 10342 extending along the boundary between the display region 21 and the non-display region 22.

Referring to FIG. 15, the at least one second hydrogen absorbent sub-portion 10342 may also be disposed at the boundary between the display region 21 and the non-display region 22 and extends in the boundary between the two regions. One, two and even N second hydrogen absorbent sub-portions 10342 are provided. The number of the second hydrogen absorbent sub-portions 10342 is not limited in the embodiments of the present disclosure. Consequentially, for hydrogen elements, the at least one second hydrogen absorbent sub-portion 10342 can isolate the display region 21 from the non-display region 22 to a certain extent and prevent hydrogen elements in the non-display region 22 from diffusing into the display region 21.

Figure 16:
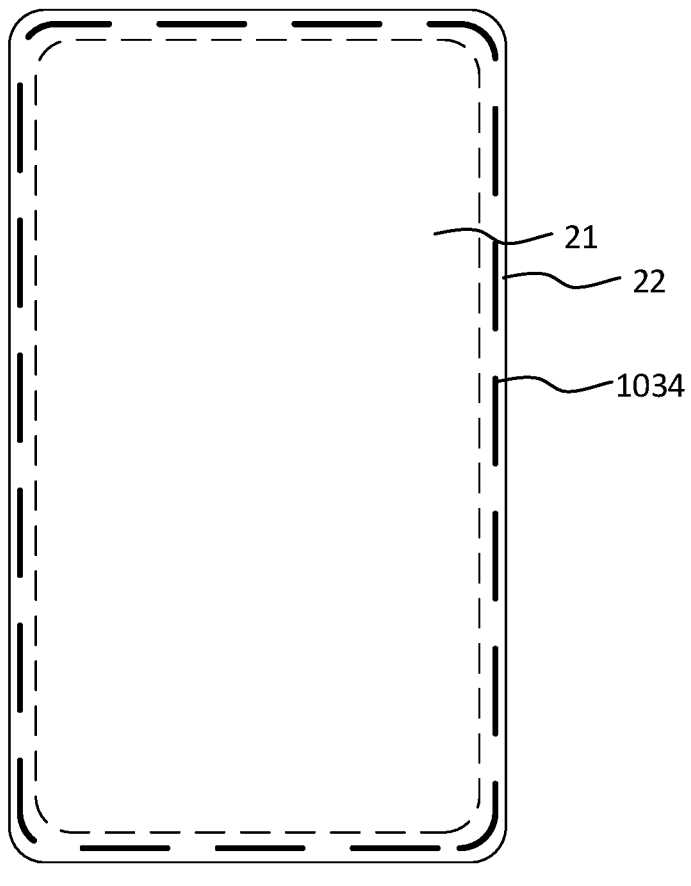
FIG. 16 is another diagram illustrating the structure of a display panel according to embodiments of the present disclosure.

FIG. 16 is another diagram illustrating the structure of a display panel according to embodiments of the present disclosure. In some optional embodiments, the hydrogen absorbent layer 1034 is disposed intermittently in the extension direction.

Referring to FIG. 16, in some optional embodiments, the hydrogen absorbent layer 1034 may extend along the boundary between the display region 21 and the non-display region 22, which is similar to FIG. 15, but in the case where the hydrogen absorbent layer 1034 continuously extends, the hydrogen absorbent layer 1034 may generate a certain electrostatic accumulation due to the excessive length of the hydrogen absorbent layer 1034, and when having excessive electrostatic accumulation, the hydrogen absorbent layer 1034 may affect other circuits in the display panel. In this regard, in the embodiments of the present disclosure, the hydrogen absorbent layer 1034 may be disposed intermittently in the extension direction to reduce the extension length of the hydrogen absorbent layer 1034 so that the charge amount or possibility of the electrostatic accumulation can be reduced, and the reliability of the hydrogen absorbent layer 1034 can be improved.

Figure 17:
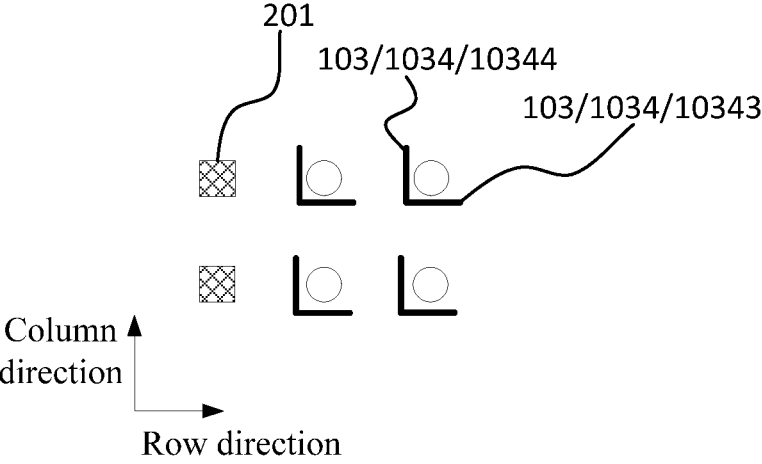
FIG. 17 is another diagram illustrating the structure of a display panel according to embodiments of the present disclosure.

FIG. 17 is another diagram illustrating the structure of a display panel according to embodiments of the present disclosure. In some optional embodiments, the display panel includes the display region 21, the display region 21 includes the multiple sub-pixels 201, and the hydrogen absorbent layer 1034 includes a first portion 10343 extending along the arrangement row direction of the multiple sub-pixels 201 and/or a second portion 10344 extending along the arrangement column direction of the multiple sub-pixels 201.

In an embodiment, the hydrogen absorbent layer 1034 may also be disposed in the vicinity of the multiple vias 1035 of the display region 21 or the non-display region 22, the hydrogen absorbent layer 1034 may include a first portion 10343 extending along the arrangement row direction of the multiple vias 1035 and/or a second portion 10344 extending along the arrangement column direction of the multiple vias 1035, and an L-shaped hydrogen absorbent layer 1034 is formed by simultaneously extending in the row direction and the column direction. Through the preceding configuration, the hydrogen absorbent effect of the hydrogen absorbent layer 1034 can be enhanced, and the reliability of the metal oxide transistor 102 can be improved.

In some optional embodiments, the hydrogen absorbent layer 1034 includes at least one of a hydrogen absorbent metal layer, graphene, carbon nanotube, or metal oxide.

In an embodiment, in the embodiments of the present disclosure, the hydrogen elements may be absorbed by materials including, but not limited to, the hydrogen absorbent metal layer, the graphene, the carbon nanotube and the metal oxide. The hydrogen absorbent metal layer may include, for example, a titanium-containing metal. In the embodiments of the present disclosure, hydrogen absorbent layers 1034 composed of different materials may be prepared through different preparation methods. Details are not repeated herein.

In some optional embodiments, the hydrogen absorbent layer 1034 is in the same layer as at least one metal layer in each pixel driving circuit of the display panel. The at least one metal layer in each pixel driving circuit in the same layer as the hydrogen absorbent layer 1034 can absorb hydrogen elements.

In an embodiment, each pixel driving circuit of the display panel includes multiple metal films, and a metal film capable of absorbing hydrogen elements is possibly present in the multiple metal films. In the embodiments of the present disclosure, the hydrogen absorbent layer 1034 in the embodiments of the present disclosure may be prepared while the at least one metal layer of each pixel driving circuit, which can absorb hydrogen elements, is prepared. With the configuration, the number of preparation processes can be reduced, and since an additional film does not need to be disposed for the hydrogen absorbent layer, the number of films can be reduced at the same time so that the thickness of the display panel can be reduced to a certain extent. In some optional embodiments, some metal layers of each pixel driving circuit include titanium metal. The hydrogen elements may diffuse into the titanium metal at a certain temperature to remain in the titanium metal lattice in a doped state or form titanium hydride with the titanium metal. After the hydrogen elements enter the titanium metal, a higher activation energy must be used for removing the hydrogen elements from the titanium metal so that the hydrogen elements in the insulating layers and the IGZO can be effectively confined in a titanium metal layer, thereby reducing the influence of the hydrogen elements on the IGZO and improving the reliability of the metal oxide transistor 102.

In some optional embodiments, the hydrogen absorbent layer 1034 is in the same layer as the active layer 1031 of the metal oxide transistor 102.

The hydrogen absorbent layer 1034 is in the same layer as the active layer 1031 of the metal oxide transistor 102 so that the active layer 1031 and the hydrogen absorbent layer 1034 can be prepared through one process when the films of the display panel are prepared, simplifying the preparation process.

Figure 18:
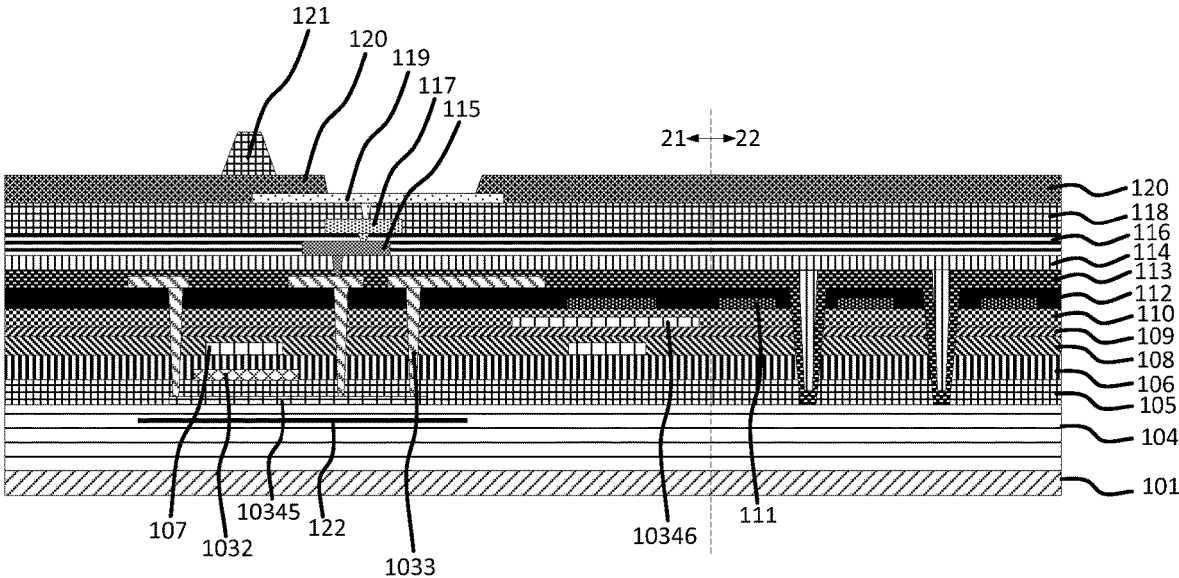
FIG. 18 is another diagram illustrating the structure of a film of a display panel according to embodiments of the present disclosure.

FIG. 18 is another diagram illustrating the structure of a film of a display panel according to embodiments of the present disclosure. Referring to FIG. 18, the display panel may include the display region 21 and the non-display region 22. For the display region 21 and the non-display region 22, the display panel may include the base substrate 101, the buffer layer 104, a light-shielding layer 122, a polycrystalline silicon active layer 10345, the first insulating layer 105, the first metal layer 1032, the second insulating layer 106, a third metal layer 107, a third insulating layer 108, a fourth insulating layer 109, a metal oxide active layer 10346, a fifth insulating layer 110, a fourth metal layer 111, a sixth insulating layer 112, the second metal layer 1033, a seventh insulating layer 113, an eighth insulating layer 114, a fifth metal layer 115, a ninth insulating layer 116, a sixth metal layer 117, a tenth insulating layer 118, a seventh metal layer 119, an eleventh insulating layer 120 and a support layer 121.

The buffer layer 104 may be composed of multiple sub-films such as a polyimide (PI) layer and a silicon oxide (SiO) layer and is not completely illustrated in FIG. 18. The material of the light-shielding layer 122 may be molybdenum (Mo). The material of the polycrystalline silicon active layer 10345 may include silicon nitride (SiN), silicon oxide (SiO), or silicon (Si). The first insulating layer 105 may be denoted as a GI1 layer, and the material of the first insulating layer 105 may be SiO. The first metal layer 1032 may be denoted as an M1 layer, and the material of the first metal layer 1032 may be Mo. The second insulating layer 106 may be denoted as an IMD layer, and the material of the second insulating layer 106 may be SiN. The third metal layer 107 may be denoted as an MC layer, and the material of the third metal layer 107 may be Mo. The third insulating layer 108 may be denoted as an ILD1 layer, and the material of the third insulating layer 108 may include SiO or SiN. The fourth insulating layer 109 may be denoted as a GI2 layer, and the material of the fourth insulating layer 109 may be SiO. The material of the metal oxide active layer 10346 may be IGZO. The fifth insulating layer 110 may be denoted as a GI3 layer, and the material of the fifth insulating layer 110 may be SiO. The fourth metal layer 111 may be denoted as an MG layer, and the material of the fourth metal layer 111 may include titanium (Ti) or Mo. The sixth insulating layer 112 may be denoted as an ILD2 layer, and the material of the sixth insulating layer 112 may include SiO or SiN. The second metal layer 1033 may be denoted as an M2 layer, and the material of the second metal layer 1033 may include Ti or aluminum (Al). The seventh insulating layer 113 may be denoted as a PV layer, and the material of the seventh insulating layer 113 may be SiN. The eighth insulating layer 114 may be denoted as a PLN1 layer and may be an organic layer. The fifth metal layer 115 may be denoted as an M3 layer, and the material of the fifth metal layer 115 may be Ti or Al. The ninth insulating layer 116 may be denoted as a PLN2 layer and may be an organic layer. The sixth metal layer 117 may be denoted as an M4 layer and may be an organic layer. The tenth insulating layer 118 may be denoted as a PLN3 layer and may be an organic layer. The seventh metal layer 119 may be denoted as an RE layer, and the material of the seventh metal layer 119 may be indium tin oxide (ITO) or silver. The eleventh insulating layer 120 may be denoted as a PDL layer and may be an organic layer. The support layer 121 may be denoted as a PS layer and may be an organic layer.

In the embodiments of the present disclosure, at least the fourth metal layer 111, the second metal layer 1033, the fifth metal layer 115 and the sixth metal layer 117 may each contain titanium elements, and the first insulating layer 105 to the seventh insulating layer 113 may each contain hydrogen elements. In the embodiments of the present disclosure, the hydrogen absorbent layer 1034 may be disposed in at least one titanium-containing metal layer among the fourth metal layer 111, the second metal layer 1033, the fifth metal layer 115 and the sixth metal layer 117.

In the structure corresponding to FIG. 18, the multiple vias 1035 may be disposed in the non-display region, and the multiple vias 1035 in the embodiments of the present disclosure may be etched to dig holes in any position that does not affect the metal lines. The content of the hydrogen elements in the active layer 1031 can be reduced through the preceding solution.

Figure 19:
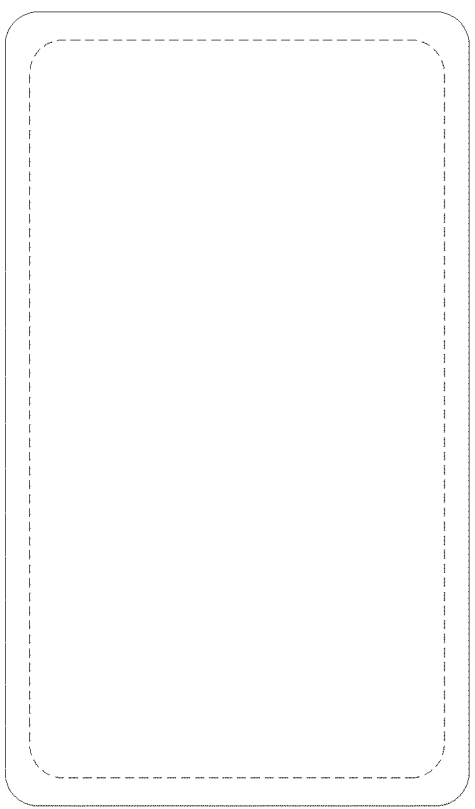
FIG. 19 is a diagram illustrating the structure of a display device according to embodiments of the present disclosure.

FIG. 19 is a diagram illustrating the structure of a display device according to embodiments of the present disclosure. Referring to FIG. 19, the display device may include the display panel according to any one of the preceding display panel embodiments.

The display device provided by the embodiments of the present disclosure may include the display panel in the preceding embodiments, so the same or at least similar technical effects as those of the preceding display panel embodiments can be achieved, and details are not described herein.

It is to be noted that in the description, relationship terms such as "first" and "second" are merely used for distinguishing one entity or operation from another and do not necessarily require or imply any such actual relationship or order between these entities or operations. Furthermore, the term "comprising", "including" or any other variant thereof is intended to encompass a non-exclusive inclusion so that a process, method, article, or device that includes a series of elements not only includes those elements but also includes other elements that are not expressly listed or are inherent to such process, method, article, or device. In the absence of more restrictions, the elements defined by the statement "including a . . . " do not exclude the presence of additional identical elements in the process, method, article, or device that includes the elements.

The preceding are merely specific embodiments of the present disclosure, from which those skilled in the art can understand or perform the present disclosure. Various modifications to these embodiments will be apparent to those skilled in the art, and the general principles defined herein may be implemented in other embodiments without departing from the spirit or scope of the present disclosure. Therefore, the present disclosure is not intended to be limited to these embodiments described herein but is to be accorded the widest scope consistent with the principles and novel features disclosed herein.

What is claimed is:

1. A display panel, comprising a base substrate, a metal oxide transistor and a performance adjustment portion both of which are located on the base substrate,
   wherein the metal oxide transistor and the performance adjustment portion do not overlap in a thickness direction of the display panel.

2. The display panel according to claim 1, comprising a display region, wherein the display region comprises a plurality of sub-pixels and a plurality of pixel driving circuits, a sub-pixel of the plurality of sub-pixels is connected to a pixel driving circuit of the plurality of pixel driving circuits, and the pixel driving circuit comprises the metal oxide transistor.

3. The display panel according to claim 2, wherein the performance adjustment portion is located between adjacent ones of the plurality of pixel driving circuits.

4. The display panel according to claim 2, further comprising a non-display region, wherein the performance adjustment portion is located in the non-display region.

5. The display panel according to claim 4, comprising an optical component region, wherein the non-display region comprises a wiring region surrounding the optical component region, the display region surrounds the wiring region, and at least part of the performance adjustment portion is located in the wiring region.

6. The display panel according to claim 4, comprising an optical component region, wherein the non-display region comprises a bezel region surrounding the optical component region, and the display region surrounds the bezel region and comprises a first display region and a second display region that are located on two sides of the optical component region respectively; and
   the display panel further comprises a plurality of signal lines, a signal line of the plurality of signal lines comprise a first sub-portion and a second sub-portion, the first sub-portion is disposed in the first display region, the second sub-portion is disposed in the second display region, the signal line further comprise a coiling portion connecting the first sub-portion and the second sub-portion, the coiling portion is disposed in the display region, and at least part of the performance adjustment portion is located in the bezel region.

7. The display panel according to claim 4, wherein the non-display region surrounds at least part of the display region.

8. The display panel according to claim 1, comprising a display region and a non-display region, wherein the non-display region comprises a peripheral circuit, the peripheral circuit comprises the metal oxide transistor, and the performance adjustment portion is disposed in the non-display region.

9. The display panel according to claim 1, wherein the performance adjustment portion comprises a hydrogen absorbent layer and/or a plurality of vias,
   wherein the plurality of vias pass through at least part of insulating layers of the display panel.

10. The display panel according to claim 9, wherein the hydrogen absorbent layer comprises a first hydrogen absorbent sub-portion, and the first hydrogen absorbent sub-portion is located between two adjacent ones of the plurality of vias in a direction perpendicular to a plane on which the base substrate is located.

11. The display panel according to claim 10, comprising a display region and a non-display region, wherein the first hydrogen absorbent sub-portion and the plurality of vias are located in the non-display region, and the plurality of vias are arranged in an array in the non-display region,
   wherein among at least one column of vias of the plurality of vias facing away from the display region, no first hydrogen absorbent sub-portion is arranged between two adjacent vias in the direction perpendicular to the plane on which the base substrate is located.

12. The display panel according to claim 9, wherein the hydrogen absorbent layer surrounds at least one of the plurality of vias in a direction perpendicular to a plane on which the base substrate is located.

13. The display panel according to claim 12, wherein the hydrogen absorbent layer is in a grid shape.

14. The display panel according to claim 9, wherein the hydrogen absorbent layer is floating or is electrically connected to a fixed voltage signal.

15. The display panel according to claim 9, comprising a display region and a non-display region, wherein the hydrogen absorbent layer comprises at least one second hydrogen absorbent sub-portion extending along a boundary between the display region and the non-display region.

16. The display panel according to claim 9, wherein the hydrogen absorbent layer is disposed intermittently in an extension direction of the hydrogen absorbent layer.

17. The display panel according to claim 9, comprising a display region, wherein the display region comprises a plurality of sub-pixels, and the hydrogen absorbent layer comprises a first portion and/or a second portion, wherein the first portion extends along a row direction of the plurality of sub-pixels, and the second portion extends along a column direction of the plurality of sub-pixels.

18. The display panel according to claim 9, wherein the hydrogen absorbent layer comprises at least one of a hydrogen absorbent metal layer, graphene, carbon nanotube, or metal oxide.

19. The display panel according to claim 9, wherein the hydrogen absorbent layer is in a same layer as an active layer of the metal oxide transistor.

20. A display device, comprising a display panel,
   wherein the display panel comprises a base substrate, a metal oxide transistor and a performance adjustment portion both of which are located on the base substrate,
   wherein the metal oxide transistor and the performance adjustment portion do not overlap in a thickness direction of the display panel.

* * * * *